United States Patent [19]
Kramer et al.

[11] Patent Number: 5,952,946
[45] Date of Patent: Sep. 14, 1999

[54] DIGITAL-TO-ANALOG CHARGE CONVERTER EMPLOYING FLOATING GATE MOS TRANSISITORS

[75] Inventors: Alan Kramer, Berkeley, Calif.;
Roberto Canegallo, Tortona, Italy;
Mauro Chinosi, Monzese, Italy;
Giovanni Gozzini, Palazzolo, Italy;
Pier Luigi Rolandi, Monleale, Italy;
Marco Sabatini, Agrate Brianza, Italy

[73] Assignee: STMicroelectronics, S.r.l., Agrate Brianza, Italy

[21] Appl. No.: 08/941,881

[22] Filed: Sep. 30, 1997

[51] Int. Cl.⁶ .................................................. H03M 1/66
[52] U.S. Cl. ........................................ 341/136; 341/144
[58] Field of Search .................................. 341/136, 133, 341/150, 144, 118, 119

[56] References Cited

U.S. PATENT DOCUMENTS

| | | | |
|---|---|---|---|
| 5,014,055 | 5/1991 | Dingwall et al. | 341/159 |
| 5,162,801 | 11/1992 | Powell et al. | 341/150 |
| 5,376,935 | 12/1994 | Seligson | 341/136 |

OTHER PUBLICATIONS

Kramer et al., "Flash–Based Programmable Nonlinear Capacitor for Switched–Capacitor Implementations of Neural Networks," in *Technical Digest of the International Electron Devices Meeting*, IEEE, San Francisco, Dec. 11–14, 1994, pp. 449–452.

*Primary Examiner*—Brian Young
*Attorney, Agent, or Firm*—Seed and Berry LLP; David V. Carlson; Kevin S. Ross

[57] ABSTRACT

The present invention relates to a digital-to-analog converter having a plurality of inputs for digital signals, and an output for an analog signal. It also contains a charge integration circuit having an input and an output coupled to the converter output, and a plurality of floating gate MOS transistors corresponding to the plurality of converter inputs, the MOS transistors all having their source and drain terminals coupled together and to the input of the integration circuit, and having control terminals coupleable, under control from the plurality of inputs of digital signals, to different reference voltages having selected fixed values.

22 Claims, 3 Drawing Sheets

5,952,946

DIGITAL-TO-ANALOG CHARGE CONVERTER EMPLOYING FLOATING GATE MOS TRANSISTORS

TECHNICAL FIELD

The present invention relates a digital-to-analog converter and more specifically to a converter containing floating gate transistors.

BACKGROUND OF THE INVENTION

Digital-to-analog converters are widely used in the field of circuit electronics and are implemented with either discrete or integrated elements. Abundant literature is available on the subject.

From U.S. Pat. No. 5,376,935, which is hereby incorporated by reference, a digital-to-analog converter is known which includes a plurality of electrically programmable floating gate transistors, each having an electrically programmable threshold voltage. Each of the transistors has its source coupled to ground, its control gate coupled to an output node, and its drain coupled to the output node via one of a plurality of switching circuits. The output node is coupled to a voltage source via a load circuit. An input circuit decodes a digital input signal to selectively generate one of a plurality of control signals at a time in accordance with the digital input signal. Each of the control signals is for one of the switching circuits. When a transistor is coupled to the output node, the voltage level of the output node is equal to the threshold voltage of that transistor.

From A. Kramer et al., "Flash-Based Programmable Nonlinear Capacitor for Switched-Capacitor Implementation of Neural Networks," IEDM Tech. Dig., pages 17.6.1-4, December 1994, a charge injection circuit is known which is based on the use of a floating gate MOS transistor connected as a capacitor, wherein the injected/extracted charge is dependent on the threshold voltage of the transistor and the width of the voltage step supplied to its control terminal.

The article also brings out a limitation of that circuit, namely the fact that floating gate MOS transistors of the standard type have a very high parasitic overlap capacitance which dominates over the channel capacitance. This is a cause of considerable error in the charge injection. One way of partially solving this problem, as suggested in the article, is to use a MOS transistor of a particular type, that is a MOS transistor having its floating gate extended outside the channel area (included between the source and the drain areas) in the vertical direction relative to the channel length, but substantially non-overlapping the source and drain areas. Such a MOS transistor is also known, defined as a non-volatile memory cell, from Patent Application EP 0 661 756 A1. In this way, the channel capacitance is increased with respect to the parasitic capacitance, but not to a sufficient extent to make it negligible.

SUMMARY OF THE INVENTION

It is an object of the invention to provide a circuit which can be readily integrated and programmed and exhibits a good accuracy.

The object is achieved by a digital-to-analog converter comprising a charge integration circuit having an input and an output coupled to the converter output and a plurality of floating gate MOS transistors corresponding to said plurality of converter inputs having all their source and drain terminals coupled together and to the input of said charge integration circuit, and having control terminals coupleable, under control from the plurality of digital signal inputs, to different reference potentials having selected fixed values.

By using a plurality of floating gate MOS transistors with a programmable voltage threshold, as is well known, and which can be activated by the inputs of a converter and operated as charge injection circuits, and charge integration circuit to which such transistors are connected, a circuit can be provided which is readily integratable using MOS or mixed technology, is programrnmable, and exhibits an accuracy which can be well controlled, also on account of the transistor programmability.

BRIEF DESCRIPTION OF THE DRAWINGS

The invention will be more clearly apparent from the following description of an embodiment of the invention, to be read in conjunction with the accompanying drawings.

DETAILED DESCRIPTION OF THE INVENTION

As is known, floating gate MOS transistors are MOS transistors wherein, in the channel area beneath the control or gate terminal, another gate is provided which is isolated from the former and the channel. The threshold voltage of such transistors depends on the amount of charge present at their floating gate. Several ways of programming these transistors, that is of injecting/extracting charge into/from the floating gate, are known from the literature. In view of the widespread utilization of these transistors in semiconductor digital storage circuits, e.g., of the UV_EPROM, EEPROM, FLASH_EPROM types, reference can be had to the abundant literature on the subject for any enlightenment on technology and circuit design.

Figure 2:
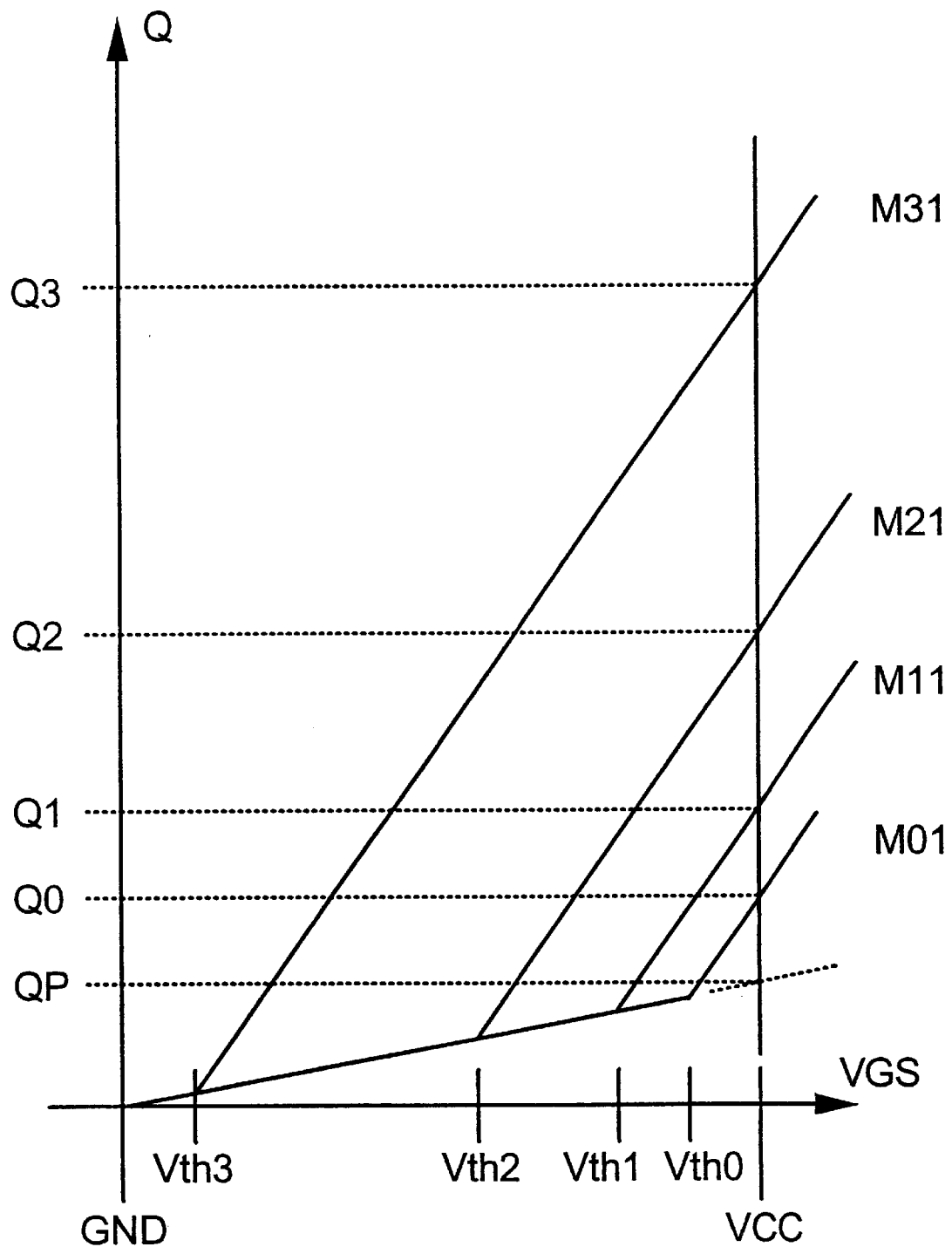
FIG. 2 illustrates possible characteristics of voltage vs. charge of the floating gate MOS transistors in the circuit of FIG. 1.

Shown in FIG. 2 of the drawings are the characteristics of gate-source VGS voltage vs. charge Q at the control terminal for four floating gate MOS transistors M01, M11, M21, M31, which are capacitor connected and have four different threshold voltages Vth0, Vth1, Vth2, Vth3, respectively. These characteristics include a first, shallow section due to parasitic overlap capacitance, and a second, steeper section due both to parasitic capacitance and channel capacitance. The second section starts at the threshold voltage, since at lower voltage values, no conductive channel is present between the source terminal and the drain terminal.

These characteristics are somewhat idealized, in that phenomena of a higher order contribute to rounding them off and leaving them non-linear.

If the control terminal of such MOS transistors accepts a step-like voltage signal, the amount of injected/extracted charge depends on the initial V1 and final V2 values of the signal, channel capacitance Cch, parasitic capacitance Cpar, and the threshold voltage value Vth, and is given by the formula:

$$\Delta Q = (Vth - V1) * Cpar + (V2 - Vth) * (Cpar + Cch).$$

All that is required to change this amount of charge in a simple manner is that the threshold voltage be varied.

Figure 1:
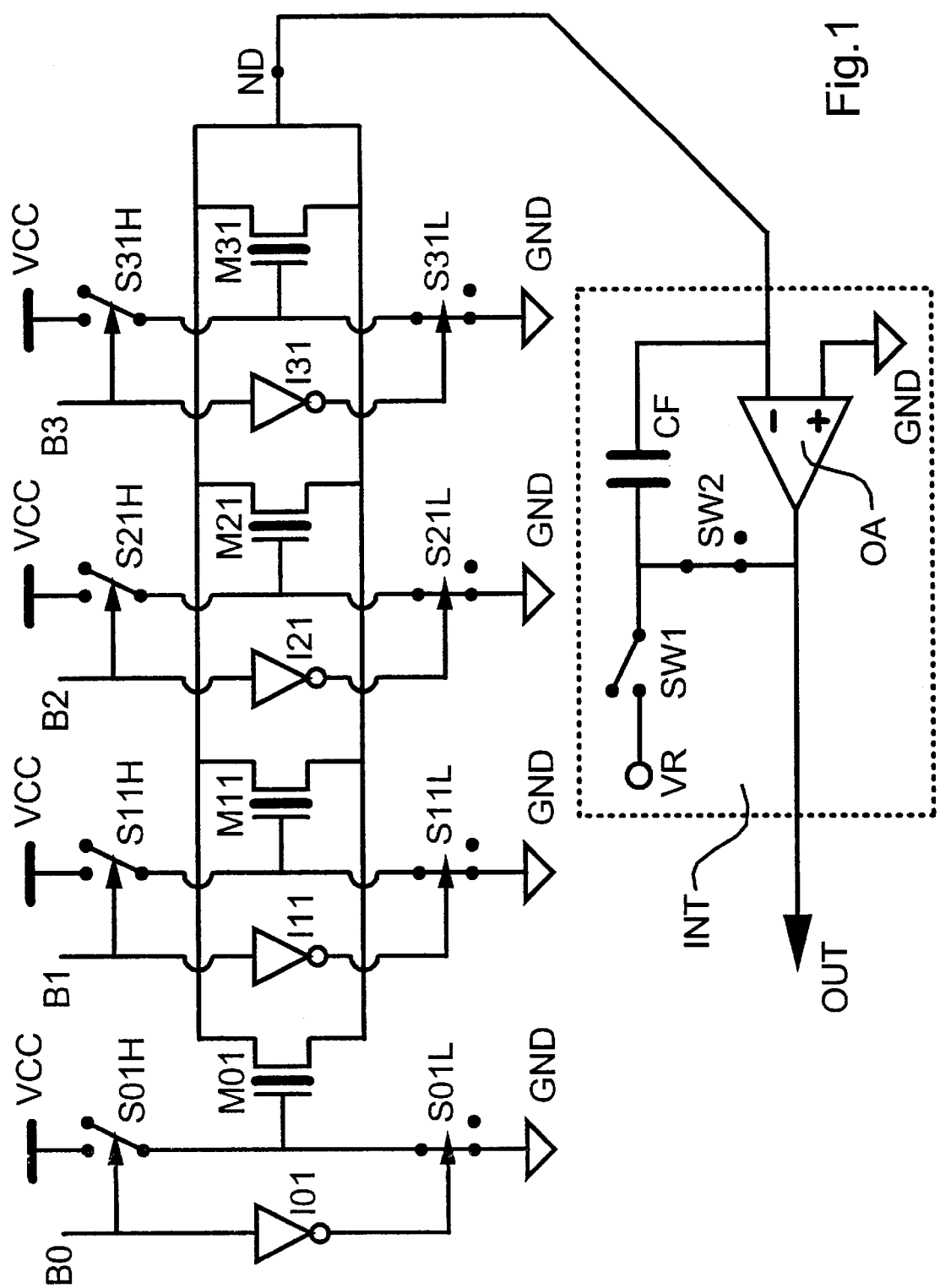
FIG. 1 is a circuit diagram of a converter according to the invention.

Referring to FIG. 1, the digital-to-analog converter according to this embodiment, has four inputs, B0, B1, B2, B3, for digital signals, and an output OUT for an analog signal. The converter comprises a charge integration circuit INT having an input ND and an output coupled to the converter output and a plurality of floating gate MOS transistors M01, M11, M21, M31 corresponding to the plurality of converter inputs B0, B1, B2, B3, having their source and drain terminals coupled together and to the input ND of the circuit INT, and having control terminals coupleable, under control from the inputs B0, B1, B2, B3, to different reference voltages having selected fixed values.

For simplicity, all the control terminals may be coupleable alternatively to two reference voltages only, specifically the ground GND and the supply VCC. This can be achieved, as shown in FIG. 1, by connecting, between the control terminal of the transistor M01 and the supply VCC, a controlled switch S01H, e.g., a traditional type of MOS transistor, and between it and the ground, a controlled switch S01L, e.g., a traditional type of MOS transistor. The input B0 could control the switch S01H directly, and the switch S01L through an inverter I01, for example. The same holds for the transistors M11, M21, M31, the inverters I11, I21, I31, and the switches S11H, S11L, S21H, S21L, S31H, S3IL.

However, if the logic levels being supplied to the inputs B0, B1, B2, B3 already correspond naturally to the two values of potential sought, these inputs may be connected directly to the control terminals of the floating gate MOS transistors. In this case, in a sense, the two reference voltages would be external of the converter. In In operation, all the control terminals are initially coupled to a first reference, the ground GND in the example of FIG. 1, and the integration circuit INT is reset. Thus, the MOS transistors will be fully discharged and the output OUT of the converter will have a selected initial value. Subsequently in operation, the control terminals of the transistors that correspond to inputs at the active logic state are coupled to a second reference, the supply VCC in the example of FIG. 1, and the control terminals of the transistors that correspond to inputs at the inactive logic state remain coupled to the first reference. In this way, some MOS transistors will inject/extract charge in amounts that, once added to the input ND and integrated by the circuit INT, will produce at the output OUT an analog signal whose width is tied to the digital signals to the inputs B0, B1, B2, B3.

It often occurs that the inputs of a digital-to-analog converter must have different weights from the output, which weights are typically tied to powers of two. In this case, the value of the threshold voltage of one transistor, e.g., M21, in the plurality that corresponds to one input, e.g., B2, is such that, for a given gate-source voltage step, the total amount of the charge shifted is substantially twice as large as the total amount of charge shifted at the transistor M11 corresponding to the next lower input in weight, B1. This can be obtained by arranging for the value of the threshold voltage of each transistor in the plurality to substantially correspond to the difference between a first constant and the product of a second constant by the power of two equaling the weight of the corresponding input to that transistor.

FIG. 2 shows possible characteristics of the transistors M01, M11, M21, M31, with their respective threshold voltages Vth0, Vth1, Vth2, Vth3 and respective shifted charges Q0, Q1, Q2, Q3 for a gate-source voltage step having a corresponding initial value to the ground GND and a final value that corresponds to the supply VCC. The charge QP corresponds to the charge shifted by each transistor independently of its threshold voltage and due to the parasitic capacitance Cpar. In this figure, the amounts of charge shifted, due to the channel capacitance Cch, namely Q0-QP, Q1-QP, Q2-QP, Q3-QP, are tied to the powers of two, whereas the parasitic capacitances Cpar make up only a negligible amount of the total.

A circuit of this type is easy to implement in integrated form, both alone and in combination with further circuitry, as shown best in FIG. 1. It is highly versatile in that the type of the conversion is dictated by the values of the threshold voltages of the floating gate MOS transistors, which can be readily changed by "programming". It is accurate because, especially in the integrated implementation, the performance of the MOS transistors is nearly the same, and any types of errors can be corrected by acting on the threshold voltage values.

A further advantage, namely compensation for temperature variations and charge leakage from the floating gates, for example, can be provided by the circuit embodiment discussed below.

Figure 3:
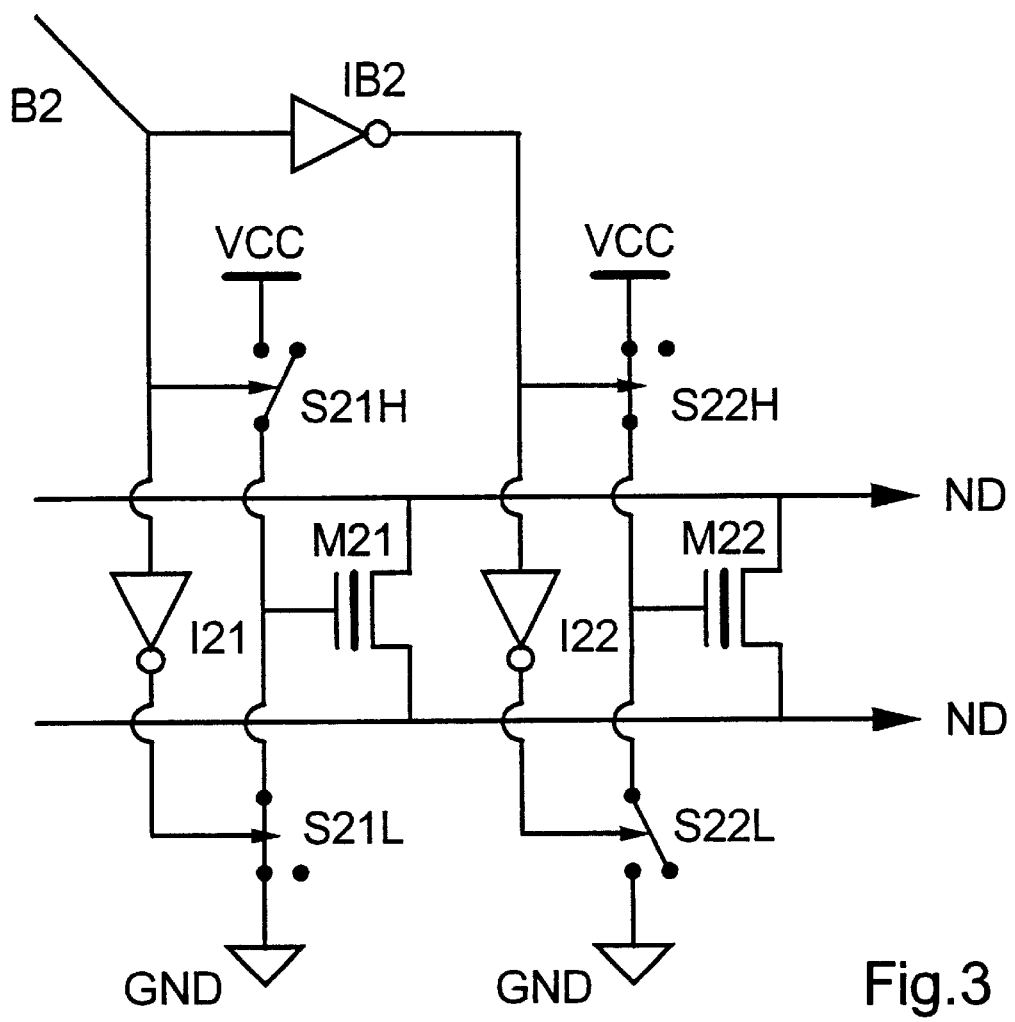
FIG. 3 is a detail view of a modified embodiment of the circuit in FIG. 1.

Referring to FIGS. 1 and 3, a converter according to this embodiment comprises an additional plurality of floating gate MOS transistors M02, M12, M22, M32 corresponding to the first M01, M11, M21, M31, having their source and drain terminals coupled together and to the input ND of the integration circuit INT, and having control terminals coupleable, under control from the inputs, to different reference voltages having a selected fixed value, the ground GND and supply VCC, respectively, in the example of FIG. 3.

Only one transistor M21 in the first plurality and a corresponding transistor M22 in the additional plurality are shown in FIG. 3. The control terminals of both transistors are controlled by the corresponding input B2 in a complementary manner, that is, when the control terminal of transistor M21 is connected to the ground GND, the control terminal of transistor M22 is connected to the supply VCC, and vice versa. The same holds for the other inputs and MOS transistors.

The complementary control is obtained, in FIG. 3, by means of an inverter IB2. The control terminal of transistor M21 is connected to the supply VCC, through a controlled switch S21H, and to the ground GND, through a controlled switch S21L. The input B2 controls the switch S21H directly, and controls the switch S21L through an inverter I21. The control terminal of transistor M22 is connected to the supply VCC, through a controlled switch S22H, and to the ground GND, through a controlled switch S22L. The input B2 controls the switch S22H through an inverter IB2, and controls the switch S22L through an inverter I22 connected in cascade with the inverter IB2.

Figure 4:
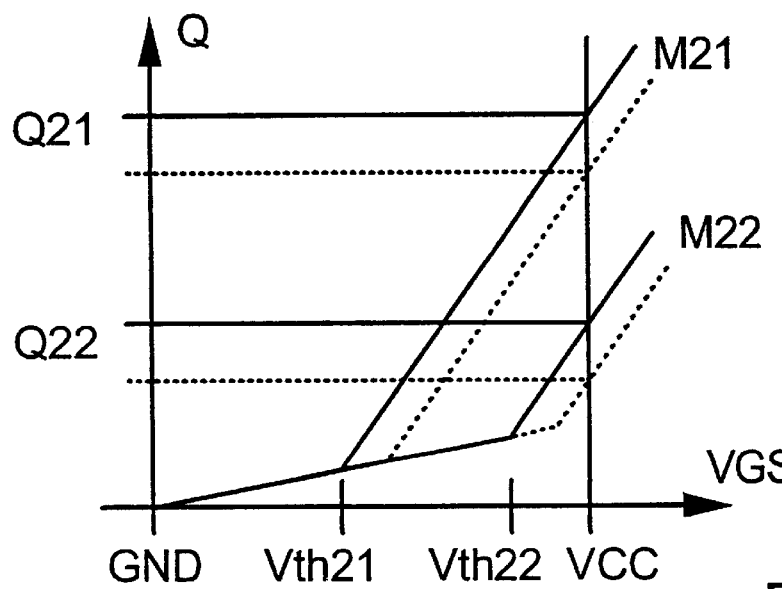
FIG. 4 illustrates possible characteristics of voltage vs charge of the MOS transistors in the circuit of FIG. 3.

Shown in FIG. 4 is a plot of gate-source voltage VGS vs. charge Q at the control terminal, illustrating possible characteristics of the transistors M21 and M22, along with their respective threshold voltages Vth21 and Vth22, and respective amounts of shifted charge, Q21 and Q22, for gate-source voltage steps whose initial and final values correspond to the ground GND and the supply VCC.

The activation of the transistor pair M21, M22 by the corresponding input B2 has a contribution on the output OUT which is proportional to the difference between Q21 and Q22. It can be seen that any changes in the width of the voltage step VGS and the threshold voltages Vth21 and Vth22 will, so long as equal in magnitude, bear no influence on this contribution. Among the possible sources of changes to the threshold voltages are temperature variations and charge leakage from the floating gates; in addition, any perturbation on either lines connecting the drain terminals to the inputs of the circuit INT would be suppressed likewise.

A suitable simple choice for the values of the threshold voltages of the transistors M02, M12, M22, M32 is the following: all substantially identical and higher 20 than the maximum value of the threshold voltages of the transistors M01, M11, M21, M31 of the first plurality; in this way, the net amount of charge shifted by the activated transistor pairs is unaffected by their parasitic capacitance Cpar, provided of course that the transistors are identical at least in each pair.

Furthermore, if the values of the threshold voltages of the transistors M02, M12, M22, M32 in the additional plurality are also lower than the highest of the values of potential of the references, the supply VCC in the example of FIGS. 3 and 4, the converter will be compensated as mentioned above.

It will be possible, of course, to select the value of the threshold voltage of each transistor of the first plurality such that it will substantially correspond to the difference between a first constant and the product of a second constant by the power of two equaling the weight of the corresponding input to the transistor. In the two last mentioned cases, however, the reducing effect of the corresponding transistor in the additional plurality on the shifted charge should be taken into account.

The operation of the converter in FIG. 3 is similar to that illustrated by FIG. 1, with the following addition: at an initial stage of its operation, the control terminals of the transistors in the additional plurality are all coupled to the second reference, and at a subsequent stage of its operation, the control terminals of the transistors in the additional plurality which correspond to inputs at the active logic state are coupled to the first reference, and the control terminals of the transistors in the additional plurality which correspond to inputs at the inactive logic state remain coupled to the second reference.

As previously mentioned, one way of reducing the effect of the parasitic capacitances consists of using MOS transistors having their floating gate extended outside the channel area in the vertical direction relative to the channel length, but substantially without overlapping the source and drain areas.

The circuit INT, shown in FIG. 1, comprises an operational amplifier OA having an inverting input connected to the input of the circuit INT, a non-inverting input connected to the ground GND, and a capacitor CF, connected in a negative feedback configuration between its output and its inverting input. Such a circuit could be reset by shorting the two terminals of the capacitor CF; in this way, however, if the amplifier OA is powered, as is to be expected normally, by connection to the same ground GND and the supply VCC, one of the two transistors that make up the output stage of the amplifier OA will be turned off. This results in that, upon restoring the circuit INT to operation, some of the charge injected at its input will be directed to turn the transistor back on, and the circuit INT cannot function as an integrator, which obviously results in conversion errors.

A viable alternative manner of obviating this problem is illustrated by FIG. 1. One of the terminals of the capacitor CF is connected to the output of the amplifier OA through a normally closed controlled switch SW2, and to a reference of potential, VR, intermediate to the ground GND and the supply VCC, through a normally open controlled switch SW1. On resetting, switch SW1 is closed and switch SW2 is opened.

To avoid the risk that, on resetting, the output of the amplifier OA may become saturated, it is advantageous to provide the operational amplifier OA with a further feedback connection, active at least during the reset operation.

As mentioned above, the floating gate MOS transistors can be programmed. If this feature of the converter is of interest, then it should also include program circuitry for the floating gate MOS transistors, controllably operable to uncouple them from one another and from the input of the integration circuit, and to couple them to references of program potential.

The present invention is, of course, likely to have various alterations, modifications, and improvements, which are readily apparent to a person skilled in the art. Such alterations, modifications, and improvements are intended to be part of the disclosure and to be within the spirit and scope of the present invention. The number of floating gate MOS transistors and corresponding digital signal inputs, for example, is not limited to four. A skilled person may choose any suitable number of devices. Accordingly, the foregoing description is only by way of example and not intended to be limiting. The present invention is only limited by the enclosed claims and equivalencies thereof.

What is claimed is:

1. A digital-to-analog converter having a plurality of inputs of digital signals, and an output for an analog signal, comprising:

a charge integration circuit having an integration input and an integration output coupled to the converter output; and a plurality of floating gate MOS transistors corresponding to said plurality of converter inputs, having all their source and drain terminals coupled together and to the integration input and having control terminals coupleable, under control by the plurality of inputs of digital signals, to different reference voltages having selected fixed values.

2. The converter according to claim 1 wherein two such reference voltages are provided, the value of one corresponding to the ground potential, and the value of the other corresponding to the supply potential.

3. The converter according to claim 1 wherein the value of the threshold voltage of each transistor corresponds substantially to the difference between a first constant and the product of a second constant by the power of two equaling the weight of the corresponding input to the transistor.

4. The converter according to claim 1 wherein, at an initial stage of its operation, the control terminals are all coupled together and to a first reference and said integration circuit is reset, and at a subsequent stage of its operation, the control terminals of the transistors that correspond to inputs at the active logic state are coupled to a second reference and the control terminals of the transistors that correspond to inputs at the inactive logic state remain coupled to the first reference.

5. The converter according to claim 1, further comprising an additional plurality of floating gate MOS transistors corresponding to the first plurality having source and drain terminals which are all coupled together and to the input of said charge integration circuit, and having control terminals which are coupleable, under control from the plurality of inputs of digital signals, to different reference voltages having selected fixed values.

6. The converter according to claim 4 wherein, during said initial stage of its operation, the control terminals of the transistors in said additional plurality are all coupled to said second reference, and during said subsequent stage of its operation, the control terminals of the transistors in said additional plurality which correspond to inputs at the active logic state are coupled to said first reference and the control terminals of the transistors in said additional plurality which correspond to inputs at the inactive logic state remain coupled to the second reference.

7. The converter according to claim 6 wherein the values of the threshold voltages of the transistors in the additional plurality are all substantially identical and higher than the maximum value of the threshold voltages of the transistors in the first plurality.

8. The converter according to claim 7 wherein the values of the threshold voltages of the transistors in the additional plurality are also lower than the highest of the values of said first and second reference voltages.

9. The converter according to claim 1 wherein the MOS transistors have their floating gate extended outside the channel area in the vertical direction relative to the channel length, but substantially without overlapping the source and drain areas.

10. The converter according to claim 1 wherein said charge integration circuit comprises an operational amplifier and a capacitor connected thereto in negative feedback relationship, resettable by connection to an intermediate potential to ground and supply.

11. The converter according to claim 10 wherein said operational amplifier has a further feedback connection such that, during said reset operation, its output will not become saturated.

12. The converter according to claim 1, further comprising program circuitry for the floating gate MOS transistors, controllably operative to uncouple them from one another and from the integration circuit input, and to couple them to references of program potential.

13. A digital-to-analog converter comprising:
 a first digital signal input for accepting a digital signal representing either a logic active or inactive state;
 a second digital signal input for accepting a digital signal representing either a logic active or inactive state;
 a first MOS transistor controlled by a first digital signal inputted at said first digital signal input and transferring a first fixed amount of charge to an output terminal, if the inputted signal represents a logic active state;
 a second MOS transistor controlled by a second digital signal inputted at said second digital input and transferring a second fixed amount of charge to an output terminal if the second digital signal represents a logic active state; and
 a charge integration circuit coupled to the output terminals of said first and second MOS transistors and outputting an analog output signal indicative of the total amount of charge transferred for a given period of time by said first and second MOS transistors.

14. The converter of claim 13 wherein the amount of charge transferred by the second MOS transistor is substantially twice as large as the amount transferred by said first MOS transistor.

15. The converter of claim 13 wherein the first and second MOS transistors are floating gate MOS transistors with programmable threshold voltages.

16. The converter of claim 15 wherein the source and drain terminals of the first and second MOS transistors are coupled together and to a charge output terminal, and wherein the control terminals of the first and second MOS transistors are coupled to a first reference voltage if the signal inputted at the respective digital signal input represents an active logic state and coupled to a second reference potential if the signal inputted at the respective digital signal input represents an inactive logic state.

17. The converter of claim 15, further comprising
 a third MOS transistor controlled by the first digital signal; and
 a fourth MOS transistor controlled by the second digital signal;
 said third and fourth MOS transistors transferring a fixed amount of charge to an output terminal if the signal inputted at the respective digital signal input represents a logic inactive state.

18. The converter of claim 17 wherein the values of the threshold voltages of the third and fourth MOS transistors are all substantially identical to each other and the values are higher than the maximum value of the threshold voltages of the first and second MOS transistor.

19. The converter of claim 15 wherein the MOS transistors have their floating gate extended outside the channel area in the vertical direction relative to the channel length, but substantially without overlapping the source and drain areas.

20. The converter of claim 15 wherein said charge integration circuit comprises an operational amplifier having an inverting and non-inverting input and an output, a capacitor connected to said inverting amplifier input and output in a negative feedback configuration, the operational amplifier resettable by connection to an intermediate potential to ground and the supply voltage.

21. The converter of claim 20 wherein said operational amplifier has a further feedback connection such that, during said reset operation, its output will not become saturated.

22. The converter of claim 15, further comprising program circuitry for said floating gate MOS transistors, controllably operative to uncouple them from one another and from the integration circuit input, and to couple them to references of program potential.

\* \* \* \* \*